United States Patent [19]

Nambu et al.

[11] Patent Number: 5,255,225

[45] Date of Patent: Oct. 19, 1993

[54] SEMICONDUCTOR INTEGRATED CIRCUIT DEVICE AND MEMORY CONSISTING OF SEMICONDUCTOR INTEGRATED CIRCUIT

[75] Inventors: Hiroaki Nambu, Sagamihara; Noriyuki Homma, Kodaira; Kunihiko Yamaguchi, Sayama; Kazuo Kanetani, Akishima; Hisayuki Higuchi, Kokubunji; Youji Idei, Asaka; Kenichi Ohata, Tachikawa; Yoshiaki Sakurai, Kokubunji; Masanori Odaka, Kodaira; Goro Kitsukawa, Hinodemachi; Nobuo Tamba, Ome; Masayuki Ohayashi, Ome; Toshiro Hiramoto, Ome; Kayoko Saito, Hamura, all of Japan

[73] Assignees: Hitachi, Ltd., Tokyo; Hitachi Device Engineering Co., Ltd., Chiba, both of Japan

[21] Appl. No.: 845,557

[22] Filed: Mar. 4, 1992

[63] Continuation-in-part of Ser. No. 503,765, Apr. 3, 1990.

[30] Foreign Application Priority Data

| Jul. 5, 1989 | [JP] | Japan | 1-084863 |
| Jul. 19, 1989 | [JP] | Japan | 1-184691 |
| Aug. 16, 1989 | [JP] | Japan | 1-210083 |
| Mar. 4, 1991 | [JP] | Japan | 3-062646 |

[51] Int. Cl.$^5$ .............................. G11C 11/40
[52] U.S. Cl. .................. 365/189.11; 365/174; 365/179
[58] Field of Search ............ 365/174, 177, 154, 155, 365/179, 189.11, 182

[56] References Cited

U.S. PATENT DOCUMENTS 5,047,985 9/1991 Miyaji .................. 365/154

FOREIGN PATENT DOCUMENTS 56-32463 8/1979 Japan.
55-86170 6/1980 Japan.
56-141897 9/1981 Japan.

OTHER PUBLICATIONS

B5700-03, High-Speed Srams, M. Matsui, et al. 1989

Primary Examiner—Terrell W. Fears
Attorney, Agent, or Firm—Antonelli, Terry, Stout & Kraus

[57] ABSTRACT

A semiconductor integrated circuit device including a level conversion circuit in which the simplifying of the circuit and the increasing of the speed of operation have been attained is provided.

A pair of complementary output signals amplified to a required signal level by a current switch circuit including differential transistors which receive an input signal and a reference voltage are inputted into a pair of emitter follower circuits. An emitter follower output transistor is driven by an output signal from one emitter follower circuit, while an N-channel MOSFET provided between the output transistor and a current source used as a load is driven by an output signal from the other emitter follower circuit, to obtain a level-amplified output signal from an emitter of the output transistor.

The speed of an operation of the circuit device can be increased to a high level owing to a simple circuit in which a level, which is required to attain an output amplitude, of complementary output signals is secured by the current switch circuit, the amplified complementary signals being inputted into the emitter follower circuit to directly drive the output transistor.

28 Claims, 5 Drawing Sheets

1

SEMICONDUCTOR INTEGRATED CIRCUIT DEVICE AND MEMORY CONSISTING OF SEMICONDUCTOR INTEGRATED CIRCUIT

This application is a continuation-in-part application Ser. No. 07/503,765, filed on Apr. 3, 1990 to H. Nanbu et al, the disclosure of which is incorporated by reference.

BACKGROUND OF THE INVENTION

This invention relates to a semiconductor integrated circuit device, and more particularly to the techniques effectively utilized for a static RAM (random access memory) consisting of a bipolar-CMOS (complementary MOS) having interchangeability with an ECL (emitter coupled logic) circuit, which is a so-called ECL interfaceable bipolar-CMOS.

There is a static RAM consisting of a bipolar-CMOS using an ECL circuit as an input/output circuit, in which a memory cell is formed with a CMOS circuit with efforts made toward the increasing of integration and the reducing of power consumption. This static RAM requires a level conversion circuit adapted to convert a signal of an ECL level of a small amplitude into that of a CMOS level. An example of the static RAM consisting of a bipolar-CMOS provided with such a level conversion circuit is discussed, for example, in the 1989 1SSCC Digest of Technical Papers, pages 38–40.

A conventional static RAM consisting of a bipolar-CMOS, a typical example of which is disclosed in the above-mentioned publication, requires a level converter for converting a signal of an ECL level into that of a CMOS level and uses a CMOS circuit, which lowers an operation speed of the RAM accordingly.

SUMMARY OF THE INVENTION

An object of the present invention is to provide a semiconductor integrated circuit device including a level conversion circuit which has attained the simplification of the circuit and the increasing of the speed of operation.

Another object of the present invention is to provide a semiconductor integrated circuit device including a static RAM which consists of a bipolar-CMOS, and which has attained the increasing of the speed of operation and the reducing of power consumption.

The above and other objects as well as novel features of the invention will become apparent from the descriptions in this specification and the accompanying drawings.

The following is a brief description of the outline of a typical invention out of the inventions disclosed in this specification. A pair of complementary output signals which have been amplified to a required level in a current switch circuit including a differential transistor adapted to receive an input signal and a reference voltage are inputted into a pair of emitter follower circuit, and an emitter follower output transistor is driven by an output signal from one emitter follower circuit, an N-channel MOSFET which is provided between the output transistor and a current source used as a load being driven by an output signal from the other emitter follower circuit to obtain a level-amplified output signal from an emitter of the output transistor.

According to the means mentioned above, the speed of an operation can be increased to a high level by a simple circuit in which a signal level required for attaining a proper output amplitude is secured by the current switch circuit, and the output transistor is driven directly by the resultant signal through the emitter follower circuit.

DESCRIPTION OF THE PREFERRED EMBODIMENTS

Figure 1:
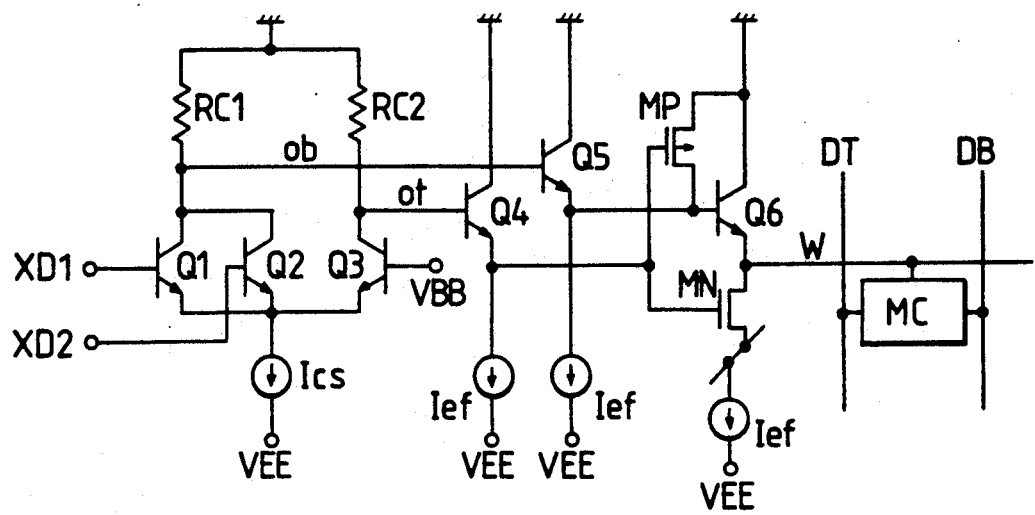
FIG. 1 is a circuit diagram showing an example of the level conversion circuit used in the present invention.

FIG. 1 is a diagram showing an example of the level conversion circuit used in the present invention. The circuit elements shown in the drawing are formed on one semiconductor substrate of monocrystalline silicon by known bipolar CMOS integrated circuit manufacturing techniques. The bipolar transistors which will hereinafter be referred to shall be NPN-type transistors, which are designated by the letter "Q" in the drawing. On the other hand, an N-channel MOSFET is designated by the letters "MN", and a P-channel MOSFET "MP".

This embodiment is formed so that a level conversion circuit, which can be used as a word line selecting circuit for a static RAM consisting of an ECL interfaceable bipolar CMOS, and which is adapted to generate a word line selecting signal, is also provided with a logic function which forms a decoding circuit.

The input signals XD1, XD2 are predecoding signals which will be described later, and they are turned into signals of an ECL level. These signals are supplied to the bases of transistors Q1, Q2 which have been set in a parallel mode so as to be provided with a logic function. A transistor Q3 which has been set in a differential mode with respect to the transistors Q1, Q2 in a parallel mode is provided. A reference voltage VBB corresponding to the input level is supplied to the base of the transistor Q3.

The collectors of the transistors Q1, Q2 in a parallel mode and that of the transistor Q3 are provided with load resistors RC1, RC2 respectively. The emitters of the transistors Q1–Q3 in a differential mode mentioned above are provided with a constant current source Ics.

The construction of a differential circuit in this embodiment is identical with that of an ECL circuit, and an output signal (Ics ×RC1) or (Ics and resistors RC1, RC2 is set to a level higher than a regular ECL level. Namely, this output signal is set to a comparatively high level so that this level corresponds to a selection level or a non-selection level at the word lines in a memory array consisting of a CMOS circuit which will be described later, and to the level of an input signal at the CMOS circuit.

The complementary output signals consisting of an inverted output signal ob and a non-inverted output signal ot formed by the resistors RC1, RC2 in a current switch circuit including the above-mentioned differential transistors Q1–Q3 are supplied to the bases of emitter follower transistors Q5, Q4 respectively. The emitters of these emitter follower transistors Q4, Q5 are provided with constant current sources Ief as loads. An emitter follower output signal corresponding to the inverted output signal ob from the current switch circuit is supplied to the base of an output transistor Q6. An emitter follower output signal corresponding to the non-inverted output signal ot from the current switch circuit is supplied to the gate of an N-channel MOSFET MN provided at the emitter of the output transistor Q6 and used for an active pulldown operation. The source of this N-channel MOSFET MN used for an active pulldown operation is provided with a constant current source Ief to be used in common with another word line selecting circuit of the same construction having both a level converting function and a logic function.

A P-channel MOSFET MP for an active pullup operation is provided, though a special limitation is not placed thereto, between the base and collector of the output transistor Q6 for compensating a shortage for a high level to be attained of an output signal, and an emitter follower output signal corresponding to the non-inverted output signal ot is supplied to this MOSFET MP. A threshold voltage (Vth) of this MOSFET MP is set to, for example, −0.5 V since the MOSFET is operated as if it were turned off by an emitter follower output signal of a high level corresponding to the non-inverted output signal ot.

The emitter of the emitter follower output transistor Q6 is connected to a word line W. One memory cell MC is shown as an example in FIG. 1, and the word line is connected to an address selecting terminal of the memory cell. The input/output nodes of the memory cell MC are connected to a pair of complementary data lines consisting of a non-inverted data line (bit line or digit line) DT and an inverted data line DB.

A power source voltage at a high level side of a circuit is set to earth potential, such as zero volt correspondingly to the ECL circuit, and a power source voltage VEE at a low level side of the circuit to a negative level, such as −4 V, though it is not specially limited to this level.

The low level of an output signal which has been level-converted by the circuit in this embodiment is determined in accordance with the following equation (1).

$$VL = -[Ics \times Rc1 + VBE(Q5) + VBE(Q6)] \quad (1)$$

wherein VBE(Q5) and VBE(Q6) represent voltages between the bases and emitters of the emitter follower transistors Q5, Q6.

When an output signal of such a low level VL is formed, an output signal ot in the opposite phase is set to a high level, and an N-channel MOSFET MN for an active pulldown operation is turned on. Therefore, the word line W can be drawn out at a high speed to a low level VL by means of a current from the constant current source Ief. Since the address selecting transmission gate MOSFET's constituting a plurality of memory cells MC are connected to the word line W, the word line W has a load of a comparatively large capacity but the word line W is drawn out to a low level at a high speed by the constant current Ief occurring when this N-channel MOSFET MN for an active pulldown operation is turned on.

The high level VH of an output signal which has been level-converted by the circuit in this embodiment is determined in accordance with the following equation (2).

$$VH = -VBE(Q6) \quad (2)$$

When the level of the inverted output signal ob from the current switch circuit is high, the emitter follower output transistors Q5, Q6 are set in a Darlington mode, so that the signal ob can rise at a high speed from the above-mentioned low level VL to −[VBE(Q5)+VBE(Q6)]. Namely, a signal varying component of Ics×RC1 causes the word line to rise at a high speed in accordance with the variation of a signal from the differential switch circuit. At this time, the P-channel MOSFET MP for an active pullup operation is turned on by the non-inverted output signal ot of a low level. Consequently, the base potential of the output transistor Q6 is increased to the level of the earth potential of the circuit, so that the high level VH is increased finally to the level of the equation (2) as mentioned above. In other words, the P-channel MOSFET MP for an active pullup operation fulfills the function of compensating for a decrease in the level of the voltage VBE(Q5) between the base and emitter of the emitter follower transistor Q5.

The time t during which the word line W is thus raised from a low non-selection level to a high selection level is determined by calculating the sum of the time t1 during which the base potential of the transistor Q6 increases from the low level VL+VBE(Q6) shown in the equation (1) to −VBE(Q5) by (Ics ×RC1) owing to the emitter follower transistor Q5, the time t2 during which this potential is increased to earth potential of 0 V by the P-channel MOSFET MP for an active pullup operation, and the time t3 during which the word line W is charged with a current by the output transistor Q6.

Since the P-channel MOSFET MP already starts being turned on by the low-level non-inverted output signal ot during the time t1, the base potential of the transistor Q6 increases immediately toward the earth potential of 0 V. Furthermore, the transistor Q6 charges the word line W with a current obtained by multiplying the base current, which is supplied by the P-channel MOSFET MP, by the current amplification rate, and this enables the level of the current in the word line W to be increased at a high speed to the above-mentioned high level VH.

An absolute value of the amplitude of an output signal from the level conversion circuit in this embodiment is expressed by Ics×RC1+VBE(Q5). This signal amplitude is set so that it is incorporated into the signal amplitude in the CMOS circuit. For example, an operating voltage at the high-level side of the CMOS circuit is set to the high level VH, and an operating voltage at the low-level side thereof to the low level VL.

Concretely speaking, the negative power source voltage VEE is set to about −4 V, and the signal amplitude to around 2.4 V. Since the voltage VBE between the base and emitter of a transistor is usually around 0.8 V, Ics×RC1 is set to about 1.6 V. Therefore, in order that the differential transistors Q1-Q3 constituting the current switch circuit are not operated in a saturation region, the high levels of the input signals XD2 are suppressed to around −1.6 V.

When the ambient temperature is 25° C., the ECL level signal is at a level of a small amplitude, i.e., the high and low levels of this signal are −1.105 to −0.810 V and −1.850 to −1.475 V respectively. Accordingly, the signals XD1, XD2 of ECL level are not inputted at the above-mentioned levels into the current switch circuit; the high levels of these signals are suppressed through a suitable level shifting circuit, such as an emitter follower transistor so as not exceed −1.6 V mentioned above. In accordance with this, the reference voltage VBB is set to a level, which is obtained by level-shifting the reference voltage of an ECL level in the same manner correspondingly to the level shifting of these input signals, for example, to about −2 V.

The low level of the input signals XD1, XD2 supplied to the bases of the input differential transistors Q1, Q2 constituting the current switch circuit is set to about −2.4 V. At this time, the potential at the common emitter of the differential transistors becomes about −2.8 V, and a voltage high enough to operate a transistor constituting a constant current source or MOSFET can be secured even when the power source voltage VEE is set to a comparatively low level of −4 V as mentioned above.

Figure 2:
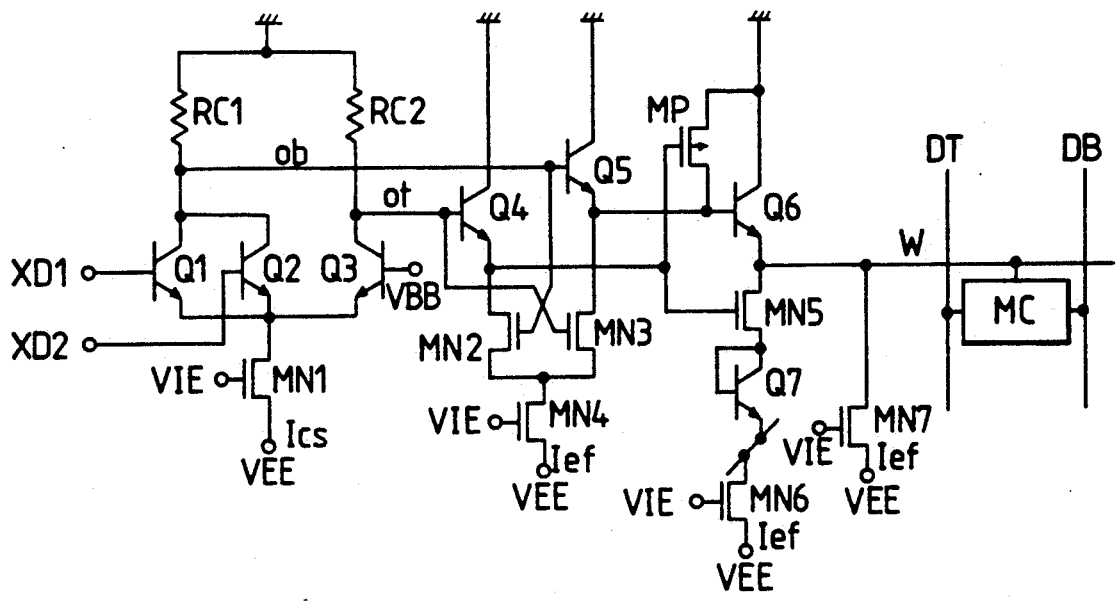
FIG. 2 is a circuit diagram showing another example of the level conversion circuit used in the present invention.

FIG. 2 is a diagram of another example of the level conversion circuit used in the present invention. The circuit elements shown in this drawing and having circuit symbols identical with those shown in FIG. 1 do not always have the same circuit functions, and it is requested that such circuit elements be interpreted basically as circuit elements different from those of FIG. 1. The same applies to the circuit elements having circuit symbols and shown in the other drawings.

In the embodiment of FIG. 2, N-channel MOSFET's MN1, MN4, MN6 are used as constant current sources Ics, Ief.

A pair of emitter follower transistors Q5, Q4 which receive a complementary output signal from a current switch circuit generate complementary output signals. In view of this, differential switches consisting of MOSFET's MN2, MN3 are provided, and a constant current source load MOSFET MN4 common to the two emitter follower transistors Q5, Q4 is used, so as to simplify the circuit and reduce the consumption of current. The input signals supplied to the bases of the non-relative emitter follower transistors Q5, Q4 are sent to the gates of the differential switches consisting of MOSFET's MN2, MN3, whereby these gates are switch-controlled between ON-state and OFF-state complementarily to each other.

For example, when the output signals ob, ot from the current switch circuit are at high and low levels respectively, the MOSFET MN2 corresponding to the emitter follower transistor Q4 which receives the low-level output signal ot is turned on by the high-level output signal ob to send the constant current Ief to the transistor Q4 and form a low-level output signal. The MOSFET MN3 provided on the emitter of the emitter follower transistor Q5 corresponding to the high-level output signal ob is then turned off by the low-level output signal ot. Consequently, the whole of the emitter current at the emitter follower transistor Q5 flows as a base current at the output transistor Q6, so that the charging current in the word line W becomes large to enable the word line to rise at a high speed.

Conversely, when the output signals ob, ot from the current switch circuit are at low and high levels respectively, the MOSFET MN3 corresponding to the emitter follower transistor Q5 which receives the low-level output signal ob is turned on by the high-level output signal ot to send the constant current Ief to the transistor Q5 and form a low-level output signal. The MOSFET MM2 provided on the emitter of the emitter follower transistor Q4 corresponding to the high-level output signal ot is then turned off by the low-level output signal ob. Therefore, the whole of the emitter current at the emitter follower transistor Q4 can be used as a charging current at the gates of P-channel MOSFET MP and N-channel MOSFET MN5, so that the time to draw out the word line W becomes early to enable the word line to fall at a high speed.

Even when the power source voltage VEE is set to −4 V with the level-converted signal amplitude set to 2.4 V as mentioned above, about 0.8 V is applied between the source and drain of the MOSFET MN1 constituting the constant current source, and, therefore, it can be operated as an excellent current source.

This embodiment is provided with a constant current source MOSFET MN7 adapted to send a weak bias current to the output transistor Q6. Owing to this MOSFET MN7, the voltage VBE between the base and emitter of the transistor Q6 corresponding to the word line W left at a non-selection level and risen to a predetermined high level after it has risen to is compensated for.

A transistor Q7 connected in a diode mode constitutes a level shifting circuit. Owing to the insertion of such a level shifting element, the source potential at the N-channel MOSFET MN5 to which the emitter current of the output transistor Q6 flows increases correspondingly. Since an N-channel MOSFET MN6 constituting a constant current source Ief is used in common with a plurality of word lines in a memory array, the MOSFET MN5 corresponding to a word line which changes from the above-mentioned high level to a low level and the MOSFET MN6 corresponding to another word line in a non-selection condition form a differential structure. Therefore, only the N-channel MOSFET MN5 corresponding to the word line which changes from a high level to a low level is substantially turned on, and the high-speed draw-out of the word line is carried out by the constant current Ief generated by the MOSFET MN6 working as a common constant current source. When this word line has then been drawn out to a predetermined low level, the constant current Ief generated by the MOSFET MN6 is set to flow in a scattered state in the output transistor Q6 corresponding to the non-selected word line.

Figure 3:
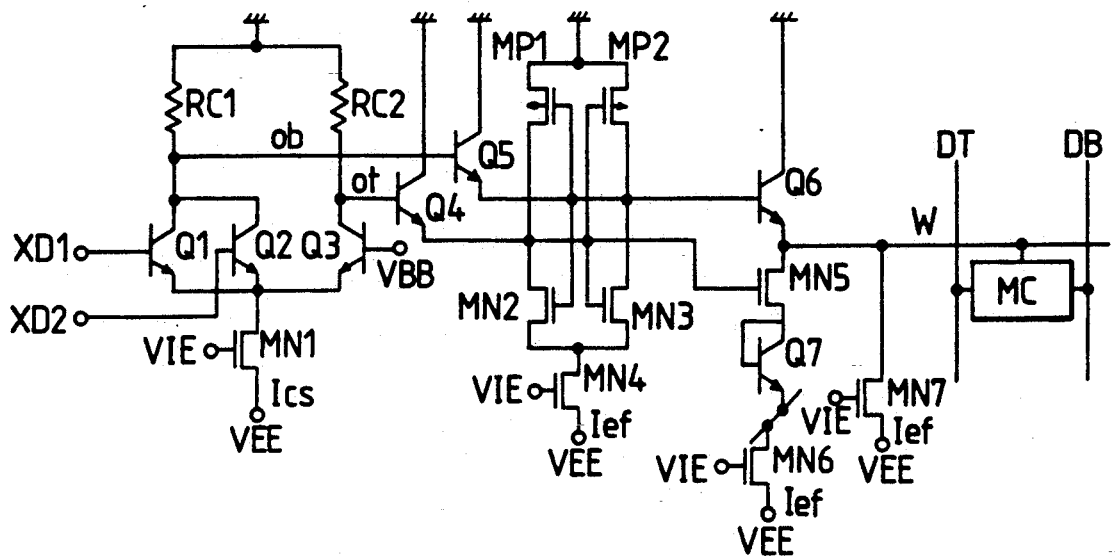
FIG. 3 is a circuit diagram showing still another example of the level conversion circuit used in the present invention.

The constant currents Ief mean emitter follower constant currents, and not that they have an equal current value. Namely, a constant current Ief generated by the MOSFET MN6 for use in carrying out the high-speed draw-out of the word line is set to a comparatively large current value, while a constant current Ief generated by a MOSFET MN7 for use in carrying out the compensation for the voltage VBE between the base and emitter of the output transistor Q6 is set to a very small current value FIG. 3 is a diagram showing still another example of the level conversion circuit in the present invention.

A latch circuit consisting of CMOS is provided on the emitters of a pair of emitter follower transistors Q5, Q4 provided at the output terminal of a current switch circuit. In other words, P-channel MOSFET MP1, MP2 are provided at the drains of constant current switching N-channel MOSFET's MN2, MN3 to actively pull up even a gate voltage of an N-channel MOSFET MN5 up to the earth potential. Namely, the gates of the P-channel MOSFET'S MP1, MP2 are used also as those of the corresponding N-channel MOSFET's MN2, MN3 to form a CMOS latch. Consequently, the high-level output signals from the two emitter follower transistors Q4, Q5 are raised up to the earth potential of 0 V. Since the gate voltage of the N-channel MOSFET MN5 is also increased to a high level, such as the level of the earth potential of the circuit, it is considered that the conductance of the MOSFET MN5 is increased to a high level. Accordingly, the size of the MOSFET MN5 for carrying out the low-level draw-out of the word line W may be reduced. As a result, the area for the layout of the MOSFET MN5 decreases, and this enables the area for the layout of a word line selecting circuit to be reduced.

Figure 4:
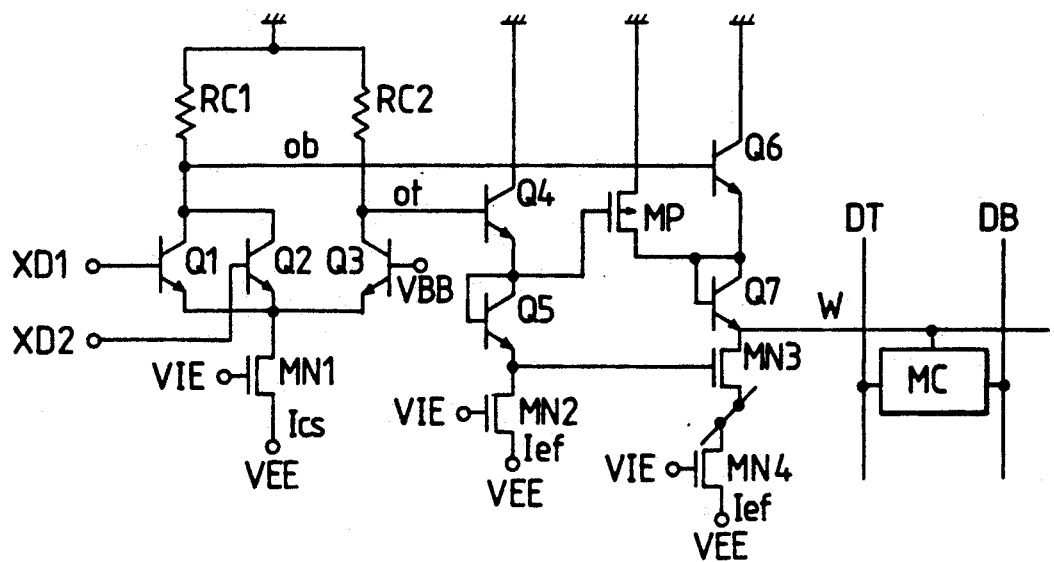
FIG. 4 is a circuit diagram showing a further example of the level conversion circuit used in the present invention.

FIG. 4 is a diagram showing a further example of the level conversion circuit in the present invention.

In this embodiment, an inverted output signal ob from a current switch circuit is supplied directly to the base of an output transistor Q6. A level shifting transistor Q7 connected in a diode mode is provided on the emitter of the transistor Q6, and it is adapted to generate a signal for selecting the word line W. On the other hand, a signal sent through a level shifting transistor Q5 identical with the above-mentioned transistor Q7 and diode-connected to the emitter of an emitter follower transistor Q4 which receives a non-inverted output signal ot from the current switch circuit is supplied to the gate of an N-channel MOSFET NM3 for an active pulldown operation which is provided on the emitter of the level shifting transistor Q7. A P-channel MOSFET MP for an active pullup operation is provided between the emitter of the output transistor Q6 and the earth potential 0 V of the circuit, and an emitter output signal from the emitter follower transistor Q4 is supplied thereto. Consequently, an offsetting current corresponding to the level shifting current generated by the transistor Q5 occurs between the gate of the N-channel MOSFET MN3 for an active pulldown operation and that of the P-channel MOSFET MP, and a DC current occurring during a signal transition period in which the P-channel MOSFET MP and N-channel MOSFET MN3 are turned on simultaneously is suppressed.

The designing concept included in the level conversion circuits shown in FIGS. 1-4 and a level conversion circuit to be described later and shown in FIG. 8 resides in ceasing to insert a MOSFET in a signal propagation path and using a MOSFET as a level setting transistor, such as a transistor for a constant current source and a transistor for a pullup or pulldown operation, and making a transistor, which is regarded as an element substantially determining a signal propagation path, and a transistor, which is regarded as an element substantially determining the signal propagation time, of bipolar transistors. A circuit having a high operation speed is formed by limiting the utilization of a MOSFET and a bipolar transistor in this manner.

FIGS. 5-8 are circuit diagrams of an embodiment of a static RAM consisting of a bipolar CMOS to which the present invention is applied.

Figure 5:
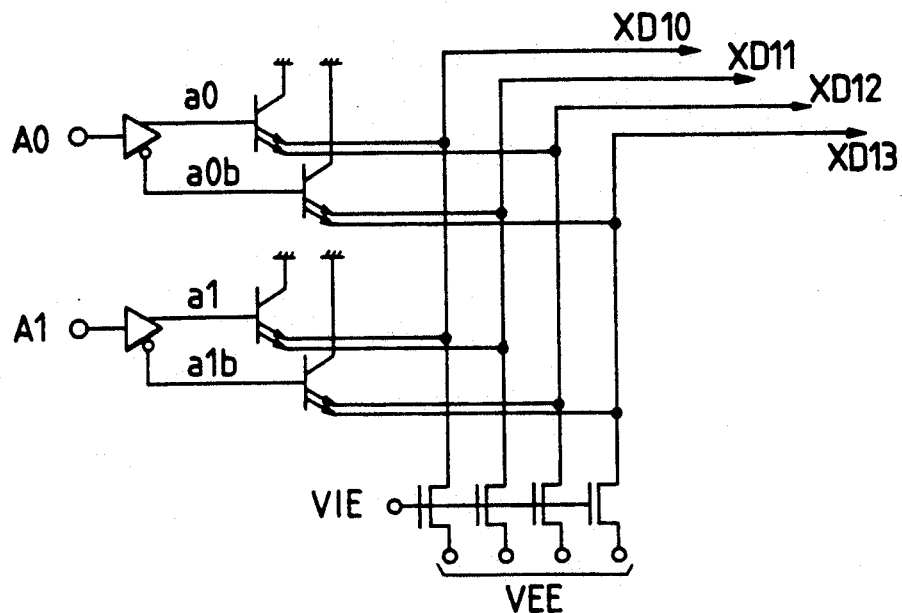
FIG. 5 is a circuit diagram showing an example of each of an address buffer and a predecoder circuit in a static RAM to which the present invention is applied.

FIG. 5 shows examples of input buffers and a predecoder circuit in this static RAN.

In this embodiment, input buffers corresponding to 2-bit address signals A0, A1, and a predecoder circuit receiving complementary output signals from these buffers and carrying out a level shifting operation, and generating four kinds of predecoding signals XD10-XD13 are shown. These input buffers consist of ECL circuits corresponding to the address signals A0, A1 of an ECL level. These input buffers receive address signals A1, A1 of an ECL level and generate internal address signals a0, a1 the phase of which is the same as that of the address signals A0, A1, and internal address signals a0b, a1b of the opposite phase.

These complementary internal address signals a0, a0b, a1, a1b are inputted into the bases of an emitter follower transistor for adopting level shifting and wired logic. In this drawing, using a transistor of a multiemitter structure is illustrated. Besides a transistor of a multi-emitter structure, a part consisting of two transistors the bases and collectors of which are connected in common may also be used.

An N-channel MOSFET constituting a constant current load in which one emitter of a transistor receiving the internal address signals a0, a1 is formed so as to be used in common with another transistor is provided. Owing to this MOSFET, a predecoding signal XD10, which is formed according to the wired OR logic that, when the level of both of the signals a0, a1 is low, the level of this signal XD1 becomes low, is generated. An N-channel MOSFET similar to the above MOSFET, constituting a constant current load in which one emitter of a transistor receiving the internal address signals a0b, a1 is formed so as to be used in common with another transistor is connected. Owing to this MOSFET, a predecoding signal XD11, which is formed according to the wired OR logic that, when the level of both of the signals a0b, a1 is low, the level of this signal XD11 becomes low, is generated. Similarly, predecoding signals XD12, XD13 are generated by the combinations of the remaining address signals a0, a1 and a0b, a1b. These predecoding signals XD10, XD11, XD12, XD13 are utilized as input signals XD1, XD2 in the circuits of FIGS. 1-4.

The constant current load MOSFET generates a constant current when a constant voltage VIE is supplied thereto.

Figure 6:
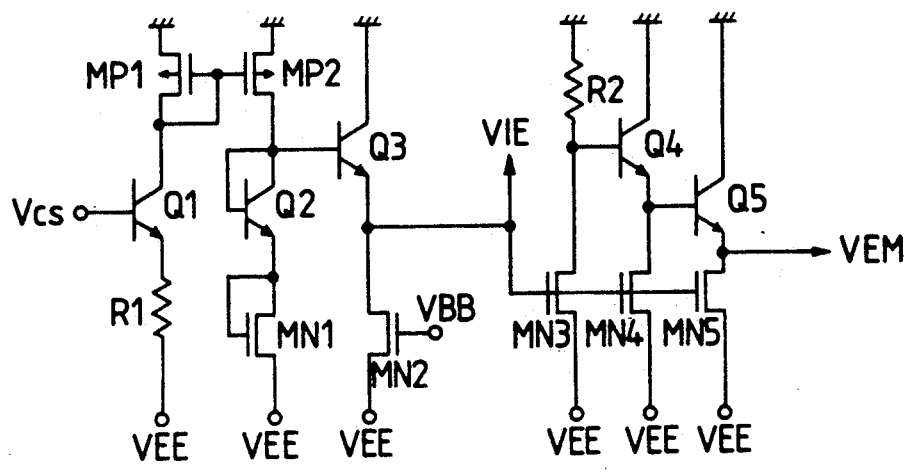
FIG. 6 is a circuit diagram showing an example of a voltage generating circuit for forming constant voltages VIE, VEM.

FIG. 6 shows an example of a circuit for generating constant voltages VIE, VEM. The constant voltage VIe is a constant voltage supplied to the gate of such a constant current load MOSFET as mentioned above, and the constant voltage VEM a constant voltage used as an operating voltage for a memory array, in other words, an operating power source voltage for a CMOS circuit.

A resistor R1 is connected to the emitter of a transistor Q1, which is adapted to receive a constant voltage Vcs, in an ECL circuit so that a constant voltage flows therein. This constant voltage is sent to a series circuit consisting of a transistor Q2 and an N-channel MOSFET MN1, both of which are in a diode mode, by P-channel MOSFET's MP1, MP2 of a current mirror mode. The diode mode transistor Q2 constitutes a level shifting circuit, and a constant voltage VTH corresponding to a threshold voltage for the MOSFET MN1 is outputted as the constant voltage VIE through an emitter follower output transistor Q3. A MOSFET MN2 adapted to receive a constant voltage VBB constitutes a load no the emitter follower output transistor Q3. In this arrangement, the constant voltage VIE corresponds to the threshold voltage VTH for the MOSFET MN1, so that a constant current in accordance with that generated by the resistor R1 occurs in the N-channel MOSFET's MN3, MN4, MN5 which receive this constant voltage VIE. For example, when the size of elements of the P-channel MOSFET's MP1, MP2 is set equal to send the same constant current generated by the resistor R1 to the N-channel MOSFET MN1, a constant current identical with that in the MOSFET MN1, i.e. the constant current flowing in the resistor R1 flows in the MOSFET's MN3-MN5 if the size of the MOSFET MN1 and those of the MOSFET's are set equal.

Accordingly, the size of the MOSFET MN3 in the drawing is set equal to that of the N-channel MOSFET MN1 generating the constant current Ics in the current switch circuits of FIGS. 1-4 so that the same constant current flows in the MOSFET MN3, and the resistance value of a resistor R2 is set equal to that of the resistor RC1 in the above-mentioned current switch circuit. If a set voltage the level of which is equal to a low-level output signal in the current switch circuit is outputted through emitter follower output transistors Q4, Q5 of a Darlington mode, a constant voltage VEM the level of which is set equal to the low level of the output signal used in the circuits of FIGS. 1-4 can be generated. The MOSFET's MN4, MN5 constitute loads on the emitter follower output transistors Q4, Q5, and the level of the current therein is set equal to that of the constant current Ief in the level conversion circuits of FIGS. 1-4. Even when this arrangement has process variations, a low-level output signal from the level conversion circuit and an operating voltage VEM on the low level side of the CMOS circuit which receives an output from the level conversion circuit vary in conjunction with each other, so that the influence of the process variations can substantially be prevented.

Figure 7:
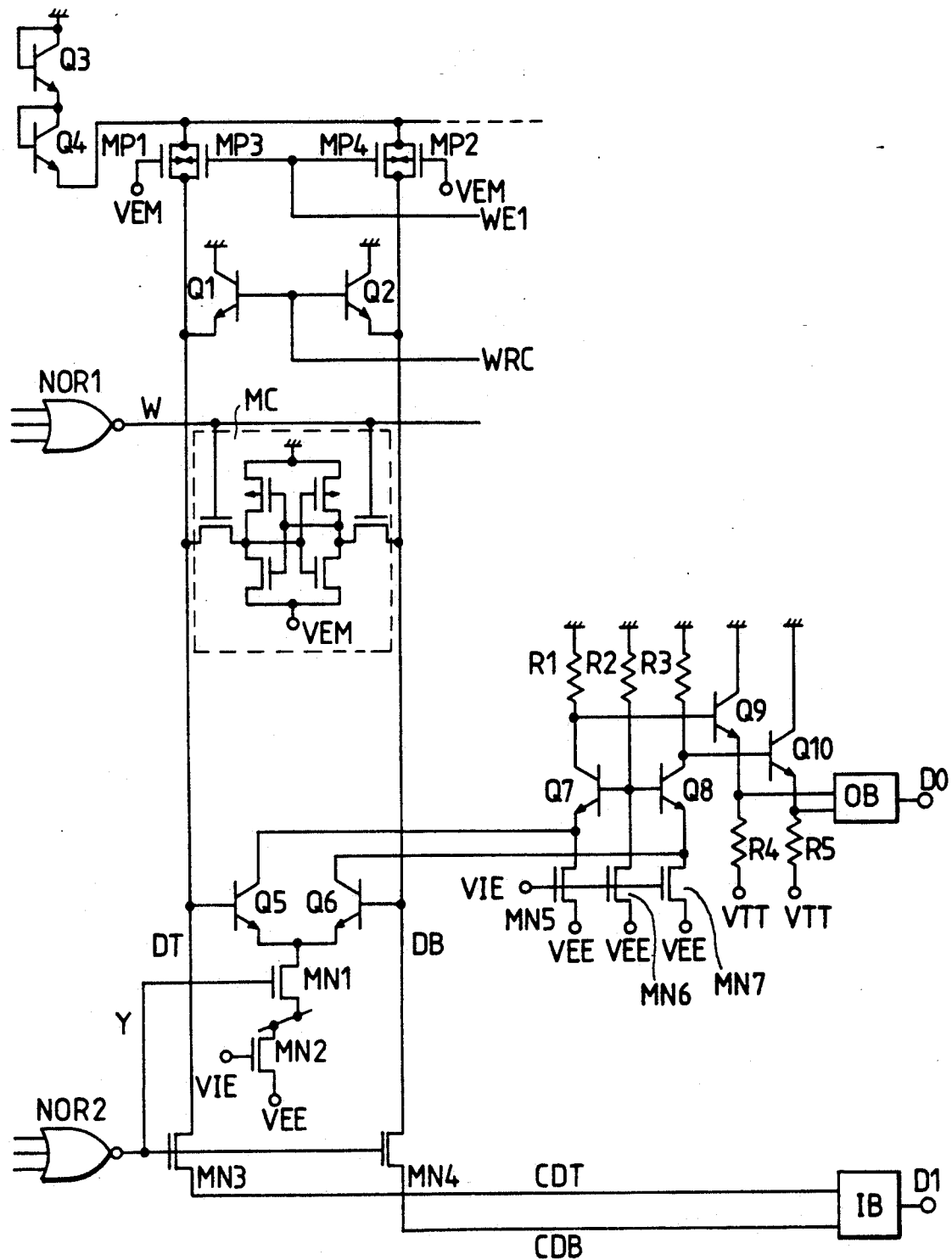
FIG. 7 is a circuit diagram showing an example of each of a memory array and its peripheral circuit in the static RAM according to the present invention.

FIG. 7 is a diagram of examples of a memory array and its peripheral circuit. This drawing shows by example one word line W, one word line selecting circuit NOR1, one memory cell MC, a pair of complementary data lines DT, DB and their load circuits, a write recovery circuit, a sense amplifier and a column switch circuit. An output circuit and a data input circuit which correspond to the sense amplifier are also drawn in the figure.

The memory cell MC consists of a CMOS latch circuit in which input and output terminals of a CMOS inverter circuit composed of a P-channel MOSFET and an N-channel MOSFET are cross-connected, and address selecting transmission gate MOSFETs provided between the input/output nodes of the latch circuit and the complementary data lines DT, DB. The operating voltage at the high level side of the memory cell is set equal to the earth potential of the circuit, and a constant voltage VEM generated by a circuit identical with the voltage generating circuit of FIG. 6 is used as the operating voltage at the low level side thereof. In this example, a memory cell of a complete CMOS structure is used, and a memory cell in which a high-resistance load consisting of a polysilicon layer is used instead of the P-channel MOSFET may also be employed. This high-resistance load is set to such a high resistance level that permits the high resistance load to send out a very low level of current which can prevent a drain leakage current from causing the storage level at the gate of the N-channel MOSFET to be lost. Therefore, the high resistance load is greatly different in meaning from a load on a regular ratio inverter circuit. When such a high resistance load is used, the size of (area occupied by) the memory cell can be reduced greatly. However, when the operating voltage at the low level side of the memory cell is set to $-3.2$ V $\sim -3.3$ V, the operation of the memory cell becomes unstable in some cases. Therefore, it is preferable to use a complete CMOS memory cell.

The gate of a transmission gate MOSFET in the memory cell is connected to a corresponding word line. This word line W is driven by a word line selecting circuit NOR1 consisting of a level conversion circuit having a logic function and composed of a circuit identical with any one of the circuits of FIGS. 1-4. When a predecoding signal shown in FIG. 5 is inputted into an input transistor in a current switch circuit in the level conversion circuit, a selection signal for one word line is generated. For example, if a signal identical with one output signal from the predecoder circuit shown in FIG. 5 is inputted into one input terminal of the 3 input terminal-carrying nor gate circuit NOR1 with a similar predecoding output signal which corresponds to address signals A2, A3 supplied to another input terminal and a similar predecoding output signal which consists of address signals A4-A6 inputted into the remaining input terminal, a circuit structure for selecting one word line from 128 word lines can be formed, and a word line selecting signal is generated in one word line selecting circuit in which all of the above predecoding signals are set to a low level.

The complementary data lines DT, DB are provided with data line load means consisting of P-channel MOSFET's MP1, MP2. These MOSFET'S MP1, MP2 are formed with the conductance thereof set comparatively low taking the writing characteristics into consideration, and a constant voltage VEM is supplied constantly to the gate thereof. The source drain paths of P-channel MOSFET's MP3, MP4 which are formed so as to have a comparatively high conductance are provided in a parallel mode on those of the MOSFET's MP1, MP2. A writing control signal WE1 is supplied to the gates of these MOSFET's MP3, MP4 to be turned on during the time in which a writing operation is not carried out. In other words, the MOSFET's MP3, MP4 constitute a data line load for a reading operation with the MOSFET's MP1, MP2. This enables a high-speed reading operation to be carried out with the signal amplitude in a complementary data line limited. On the other hand, during a writing operation, the MOSFET's MP3, MP4 which have a comparatively high conductance are turned off by the control signal WE1, and the loads on the complementary data lines DT, DB are made of MOSFET's MP1, MP2 which have only a low conductance, whereby a high-speed writing operation is carried out with the signal amplitude of data to be writted which are transmitted to the complementary data lines set large.

A bias voltage level-shifted by the diode-connected transistors Q3, Q4 is supplied to the load circuit. Namely, the high level voltage of a signal amplitude in the complementary data lines DT, DB is set to low electric potential of −2 VBE. Consequently, the signal amplitude in the complementary data lines DT, DB during a writing operation is limited to a low level, so that a high-speed writing operation can be carried out. The writing of data into the memory cell is done dominantly by a low level signal transmitted to the complementary data line DT or DB. Accordingly, no problems arise even when the high level voltage is set as low as −2 VBE as in this example. The reasons for the matter reside in that the gate potential in the ON-state storage MOSFET in the memory cell is withdrawn by the potential, which has been set low through the transmission gate MOSFET, in the complementary data line, so that the storage MOSFET is switched to an OFF-state, another storage MOSFET which has been in an OFF-state being thereby turned on to carry out the reverse writing of the data.

The complementary data lines DT, DB are connected to a pair of common complementary data lines CDT, CDB through N-channel MOSFET's MN3, MN4 for column switches. The output terminals of a data input buffer IB, which is adapted to transmit data to be written, to these common complementary data lines CDT, CDB.

A column selecting signal Y generated in a NOR-gate circuit NOR2 (column selecting circuit) consisting of the same level conversion circuit as mentioned above is supplied to the gates of the column switch MOSFET's MN3, MN4. This NOR-gate circuit NOR2 also receives a predecoding signal generated in the same predecoder circuit as mentioned above, and generates a column selecting signal.

For example, when 128×128 memory cells constituting a memory array are accessed in 16 bits, 128 word lines W, 128 pairs of complementary data lines DT, DB and 16 pairs of common complementary data lines are provided. Namely, a pair of common complementary data lines CDT, CDB per 8 pairs of data lines DT, DB are provided. In this arrangement, the predecoding signal for column switch forms 8 types of predecoding signals on the basis of 3-bit address signals A7-A9. In this case, one predecoding signal is generated, so that the level conversion circuit NOR2 receives one input signal with the logic function of the current switch circuit omitted.

The column selecting signal Y generated in the level conversion circuit NOR2 is supplied to the gates of the column switch MOSFET at once which connects 8 pairs of complementary data lines to a pair of common complementary data lines.

The bases of differential transistors Q5, Q6 constituting a sense amplifier are connected to the complementary data lines DT, DB. Namely, this memory is formed as a memory of a column sense system. The emitter common to these differential transistors Q5, Q6 is connected to a constant current MOSFET MN2 through a switch MOSFET MN1 which receives the column selecting signal Y. The constant voltage VIE is supplied to the gate of this constant current MOSFET MN2 to generate a constant current. This constant current MOSFET MN2 is provided in common with constant current MOSFET's for 8 sense amplifiers, which correspond to the 8 types of column addresses, when 128×128 memory cells are accessed in 16 bits as mentioned above.

The collectors of the differential transistors Q5, Q6 are connected to a current/voltage conversion circuit. Namely, the collectors of these transistors Q5, Q6 are connected to the emitters of transistors Q7, Q8 which are adapted to receive at their bases a bias voltage generated by a resistor R2 through which a constant current generated by a MOSFET MN6 receiving the constant voltage VIE. Constant current MOSFET's MN5, MN7 receiving the constant voltage VIE and current-/voltage conversion registors R1, R3 are provided on the emitters of these transistors Q7, Q8. A high level/low level signal corresponding to the stored information in a selected memory cell is outputted to the complementary data lines DT, DB. The differential transistors Q5, Q6 constituting a sense amplifier receive this high level/low level signal, and are put in an ON/OFF-state. A constant current then flows to the resistor R1 or R3 correspondingly to the ON/OFF-state of these differential transistors through a MOSFET MN1 put in an ON-state by the column selecting signal Y. A read signal converted into a voltage signal by these resistors R1, R3 is inputted into an output buffer OB through an emitter follower circuit consisting of transistors Q9, Q10 and emitter resistors R4, R5. This output buffer OB consists of an ECL circuit and adapted to output a signal Do of an ECL level which is in accordance with the above voltage-converted read signal.

The transistors Q1, Q2 constitutes a write recovery circuit, and is put in an ON-state by a recovery signal WRC generated after the completion of writing with a write signal transmitted thereto, whereby the resetting of the complementary data lines DT, DB, which are set to have a comparatively large level difference, is done at a high speed. The recovery signal WRC is outputted through an emitter follower output transistor. Therefore, the complementary data lines DT, DB are set to a level equal to the bias level of −2 VBE corresponding to the level in the bias circuit (transistors Q3, Q4) since the transistors Q1, Q2 are connected in a Darlington mode to the output transistor which generates the recovery signal WRC.

Figure 8:
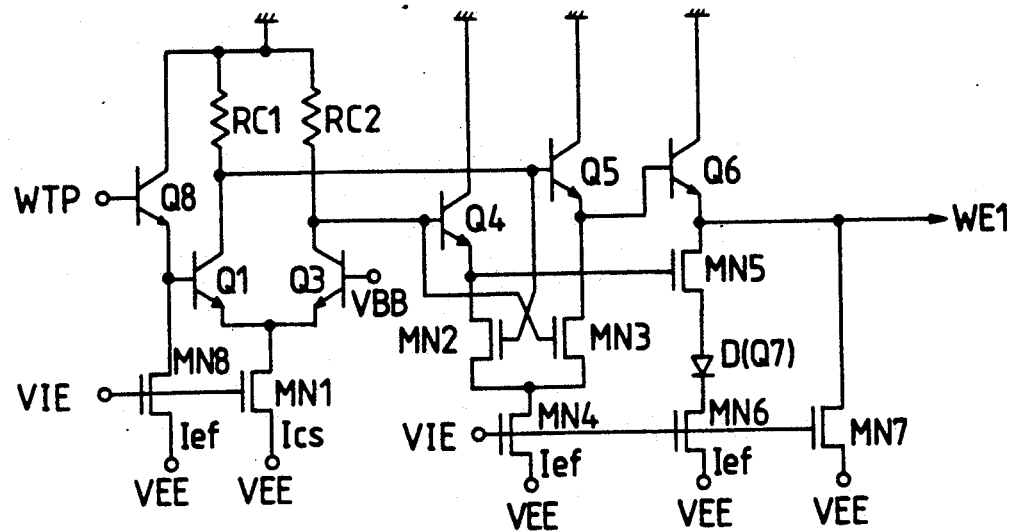
FIG. 8 is a circuit diagram showing an example of a control signal generating circuit in the static RAM according to the present invention.

FIG. 8 is a diagram of an example of a control signal generating circuit. The circuit in this drawing is formed by changing a part of the level conversion circuit of FIG. 2 in the following manner.

A write pulse WTP of an ECL level is supplied to the base of a transistor Q1, which forms a current switch circuit similar to the current switch circuit mentioned above, through a level shifting circuit consisting of an emitter follower transistor Q8 and a constant current MOSFET MN8. The level amplification is carried out in the same manner as mentioned above, by this current switch circuit, and a control signal WE1 is formed by using emitter follower transistors Q4, Q5 and an output transistor Q6. In this example, a control signal WE1 is outputted from the emitter of the output transistor Q6. A constant current MOSFET MN6 is provided on the emitter of this output transistor Q6 through an N-channel MOSFET MN5 for an active pulldown operation and a level shifting diode D (or a diode-connected transistor Q7) in the same manner as mentioned above.

In this example, a P-channel MOSFET for an active pullup operation is omitted. The reasons reside in that low electric potential of −2 VBE is supplied to the complementary data lines DT, DB by the bias circuit referred to above. Namely, a high level voltage for putting P-channel MOSFET's MP3, MP4 in an OFF-state may be −2 VBE mentioned above, and a high level output signal corresponding thereto can be generated by the Darlington-mode transistors Q5, Q6.

The circuit in which a P-channel MOSFET for an active pullup operation is omitted as mentioned above can also be utilized as a data input buffer IB. Namely, in a data input buffer IB, the high level voltage in the complementary data lines DT, DB is limited to −2 VBE as mentioned above, and the reverse writing of data into the memory cell can be carried out substantially as mentioned above by a low level voltage transmitted to the complementary data lines.

The static RAM in this example has only a comparatively small memory capacity of 128×128. Therefore, it is preferably used as an internal memory contained in an ECL gate array and a semiconductor integrated circuit of an ECL structure, though the application of this RAM is not specially limited thereto. In this case, ECL-level address signal, control signal and data signal may consist of external signals with respect to the static RAM, and it does not necessarily mean that these signals consist of external signals with respect to the semiconductor integrated circuit.

Figure 9:
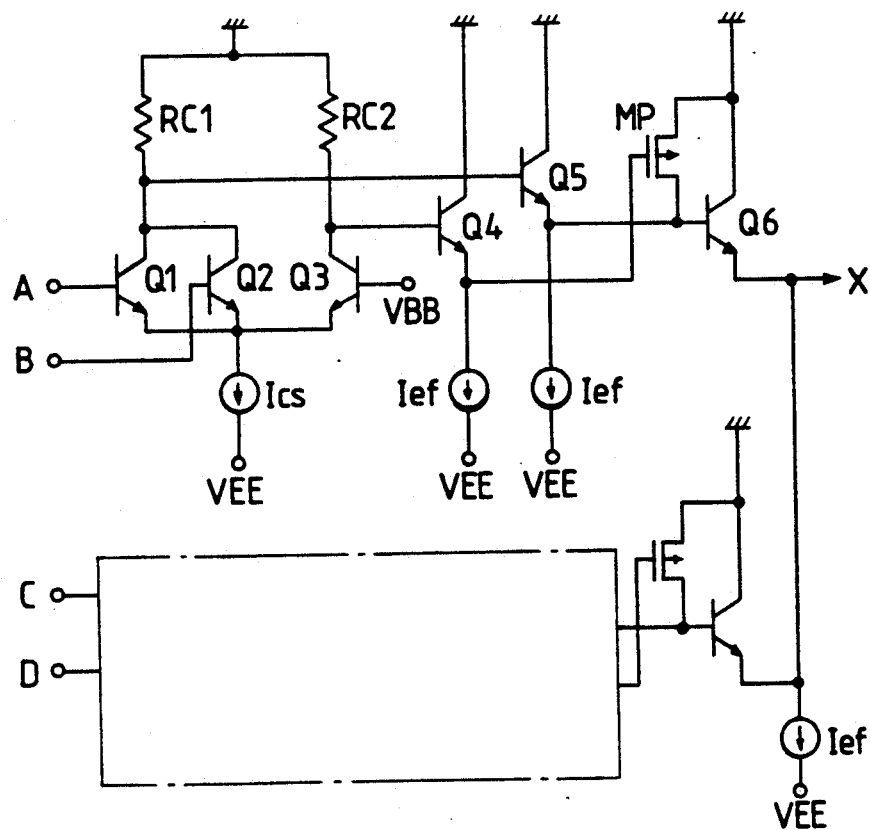
FIG. 9 is a circuit diagram showing a further example of the level conversion circuit used in the present invention.

FIG. 9 is a diagram of an example of a logic circuit based on the level conversion circuit of FIG. 1.

A level conversion circuit can be furnished with a logic function by a current switch circuit as mentioned above. Besides this, the emitter of an output transistor Q6 is provided so as to be used in common with an output transistor in another similar level conversion circuit shown by a black box, and a constant current load Ief is provided in common. In this arrangement, logic operation can be performed even in an output from the level conversion circuit, and a CMOS circuit can be driven directly by an output signal X therefrom. Thus, the level conversion circuit in the present invention can be utilized widely as an address selecting circuit for a word line and a data line in an memory circuit, such as a static RAM as well as a level conversion circuit in a CMOS circuit of an ECL interface.

The effects obtained by these embodiments are as follows.

(1) A pair of complementary output signals amplified to a required signal level by a current switch circuit including differential transistors receiving an input signal and a reference voltage are inputted into a pair of emitter follower circuits. An emitter follower output transistor is driven by an output signal from one emitter follower circuit, and an N-channel MOSFET, which is provided between the emitter follower output transistor and a load means therefor, by an output signal from the other, to generate a level-converted output signal. Since the emitter follower output transistor can be driven directly in this arrangement, a high-speed level conversion operation can be carried out.

(2) Since a P-channel MOSFET receiving an output signal from the second-mentioned emitter follower circuit is provided between the collector and base of the output transistor, the base potential of the output transistor can be set to a high level, such as earth potential. This enables a level loss on the high level side of an output signal to be minimized.

(3) Since the two emitter follower circuits are provided with a common constant current source through N-channel MOSFET's which receive input signals from the non-corresponding emitter follower circuits, the reduction of power consumption of the level conversion circuit and a high-speed operation thereof can be attained.

(4) Owing to the effects referred to in (1)-(3), the simplifying and the increasing of the speed of an operation of the static RAM of an ECL interfaceable bipolar CMOS structure can be done easily.

(5) In a static RAM including bipolar transistors and N- and P-channel MOSFET's, a MOSFET is not inserted in the signal path except a memory array portion thereof, so that the operating speed of the RAM can be increased to a high level.

The invention achieved by the inventor has been described concretely on the basis of its embodiments but it is not limited to these embodiments; it can, of course, be modified variously without departing the scope of the gist thereof. For example, the input signal consisting of an ECL level signal may also consist of a signal of a small amplitude similar thereto. The operating voltage may consist of a positive voltage in addition to a negative voltage used in an ECL circuit. The CMOS circuit may also consist of a logic circuit like a gate array in addition to the above-mentioned memory array. The ECL interfaceable static RAM may, of course, consist of a memory constituting one semiconductor memory device, in addition to a memory contained in a semiconductor integrated circuit device as mentioned above.

In the above embodiments, a column sense system (direct sense system), i.e. a sense system, in which one sense amplifier is connected directly to a pair of complementary data lines, to which the present invention is applied is described but the present invention is not limited thereto. The present invention can, of course, be applied to a static RAM of a common sense system disclosed in Japanese Patent Laid-open No. 170090/1985 (corresponding to U.S. Pat. No. 4,713,796). The common sense system referred to above is a sense system in which one sense amplifier is provided with respect to a plurality of complementary data lines.

The present invention can be utilized widely in various types of semiconductor integrated circuit device including a level conversion circuit.

The effects obtained by a typical embodiment of the invention disclosed in this application will be briefly described below. A pair of complementary output signals amplified to a required signal level by a current switch circuit including differential transistors receiving an input signal and a reference voltage are inputted into a pair of emitter follower circuits. An emitter follower output transistor is driven by an output signal from one emitter follower circuit, and an N-channel MOSFET, which is provided between the output transistor and a current source therefor by an output signal from the other, to generate a level-converted output signal. Since the emitter follower output transistor can be driven directly in this arrangement, a high-speed level conversion operation can be carried out.

What is claimed is:

1. A semiconductor integrated circuit device comprising:
    a current switch circuit which includes a first bipolar transistor having a base coupled to receive a first input signal, and a second bipolar transistor having a base coupled to receive a reference voltage and an emitter coupled to an emitter of said first bipolar transistor, and which generates lever-amplified inverted and non-inverted output signals with respect to said input signal;
    a first emitter follower transistor having a base coupled to receive said inverted output signal;
    an output emitter follower transistor which has a base coupled to receive an output signal from said first emitter follower transistors, and which generates an output signal;

a second emitter follower transistor having a base coupled to receive said non-inverted output signal;

a first current source used as a load; and a first N-channel MOSFET having a gate coupled to receive an output signal from said second emitter follower transistor, and a source-drain path coupled between said first current source and an emitter of said output emitter follower transistor.

2. A semiconductor integrated circuit device according to claim 1, further comprising:

means for setting a potential on said base of said output emitter follower transistor to a ground level when said non-inverted output signal is at a low level.

3. A semiconductor integrated circuit device according to claim 1, further comprising:

a first P-channel MOSFET having a gate coupled to receive said output signal from said second emitter follower transistor, and a source-drain path coupled between a collector and said base of said output emitter follower transistor.

4. A semiconductor integrated circuit device according to claim 3, further comprises:

a second current source used as a load;

a second N-channel MOSFET having a gate coupled to receive said non-inverted output signal, and a source-drain path coupled between said second current source and an emitter of said first emitter follower transistor; and a third N-channel MOSFET having a gate coupled to receive said inverted output signal, and a source-drain path coupled between said second current source and an emitter of said second emitter follower transistor.

5. A semiconductor integrated circuit device according to claim 4, wherein said current switch circuit further includes:

a plurality of third bipolar transistors having their bases coupled to receive a plurality of second input signals, respectively, and having their emitters coupled to said emitter of said first bipolar transistor.

6. A semiconductor integrated circuit device according to claim 5, wherein said first and second current sources respectively include N-channel MOSFETs having their gates coupled to receive a predetermined voltage.

7. A semiconductor integrated circuit device according to claim 6, wherein said first and second input signals include a low level side-shifted ECL level signal.

8. A semiconductor integrated circuit device comprising:

an input terminal receiving an input signal;

a reference voltage terminal receiving a reference voltage;

a first power source terminal receiving a first power source voltage;

a second power source terminal receiving a second power source voltage;

an output terminal sending out an output signal;

a first bipolar transistor having a base connected to said input terminal, and a collector-emitter path connected between said first and second power source terminals;

a second bipolar transistor having a base connected to said reference voltage terminal, an emitter connected to an emitter of said first bipolar transistor, and a collector-emitter path connected between said first and second power source terminals;

a first load means connected between said first power source terminal and a collector of said first bipolar transistor;

a second load means connected between said first power source terminal and a collector of said second bipolar transistor;

a first node provided between said first load means and said collector of said first bipolar transistor;

a second node provided between said second load means and said collector of said second bipolar transistor;

a first emitter follower transistor having a base connected to said first node, and a collector connected to said first power source terminal;

a second emitter follower transistor having a base connected to said second node, and a collector connected to said first power source terminal;

an output emitter follower transistor having a base connected to an emitter of said first emitter follower transistor, and a collector-emitter path connected between said first power source terminal and said output terminal; and a first N-channel MOSFET having a gate connected to an emitter of said second emitter follower transistor, and a drain-source path connected between an emitter of said output emitter follower transistor and said second power source terminal.

9. A semiconductor integrated circuit device according to claim 8 further comprising:

a P-channel MOSFET having a gate connected to said emitter of said second emitter follower transistor, and a source-drain path connected between a collector and said base of said output emitter follower transistor.

10. A semiconductor integrated circuit device according to claim 9 further comprising:

a second N-channel MOSFET having a gate connected to said base of said first emitter follower transistor, and a drain-source path connected between said emitter of said second emitter follower transistor and said second power source terminal; and a third N-channel MOSFET having a gate connected to said base of said second emitter follower transistor, a source connected to a source of said second N-channel MOSFET, and a drain-source path connected between said emitter of said first emitter follower transistor and said second power source terminal.

11. A semiconductor integrated circuit device according to claim 10 further comprising:

a first current source provided between said emitter of said first bipolar transistor and said second power source terminal;

a second current source provided between said source of said second N-channel MOSFET and said second power source terminal; and a third current source provided between a source of said first N-channel MOSFET and said second power source terminal.

12. A semiconductor integrated circuit device according to claim 11 further comprising:

a plurality of input terminals receiving a plurality of input signals; and a plurality of bipolar transistors which have bases connected to said input terminals, and which are connected in parallel with said first bipolar transistor.

13. A semiconductor integrated circuit device according to claim 12, wherein said first current source includes an N-channel MOSFET having a constant voltage receiving gate, and a drain-source path connected between said emitter of said first bipolar transistor and said second power source terminal, said second current source including an N-channel MOSFET having a constant voltage receiving gate, and a drain-source path connected between said source of said second N-channel MOSFET and said second power source terminal, said third current source including an N-channel MOSFET having a constant voltage receiving gate, and a drain-source path connected between said source of said first N-channel MOSFET and said second power source terminal.

14. A semiconductor integrated circuit device according to claim 13, wherein said first and second bipolar transistors, said first and second emitter follower transistors and said output emitter follower transistor includes NPN bipolar transistors.

15. A semiconductor integrated circuit device according to claim 14, wherein said first load means includes a resistor provided between said first power source terminal and said collector of said first bipolar transistor, and wherein said second load means include a resistor provided between said first power source terminal and said collector of said second bipolar transistor.

16. A memory formed with a semiconductor integrated circuit, comprising:
    a word line selecting circuit;
    a column selecting circuit;
    a pair of complementary data lines;
    a sense amplifier adapted to sense potential level difference between said complementary data lines;
    a switch means adapted to receive an output signal from said column selecting circuit and turn on or off said sense amplifier;
    one word line receiving an output signal from said word line selecting circuit;
    a pair of column switches receiving an output signal from said column selecting circuit and provided for selecting the pair of complementary data lines;
    one memory cell having two input/output nodes; and
    a plurality of transfer MOSFETs having gates connected to said word line, and drain-source paths between said pair of complementary data liens and said input/output nodes, respectively;
    said word line selecting circuit comprising:
    an input terminal receiving an input signal supplied thereto;
    a reference voltage terminal receiving a reference voltage;
    a first power source terminal receiving a first power source voltage;
    a second power source terminal receiving a second power source voltage;
    a terminal receiving an output signal from said word line selecting circuit;
    a bipolar transistor having a base connected to said input terminal, and a collector-emitter path connected between said first and second power source terminals;
    a second bipolar transistor having a base connected to said reference voltage terminal and an emitter connected to an emitter of said first bipolar transistor, and a collector-emitter path connected between said first and second power source terminals;
    a first load means connected between said first power source terminal and a collector of said first bipolar transistor;
    a second load means connected between said first power source terminal and a collector of said second bipolar transistor;
    a first node provided between said first load means and said collector of said first bipolar transistor;
    a second node provided between said second load dmeans and said collector of said second bipolar transistor;
    a first emitter follower transistor having a base connected to said first node and a collector connected to said first power source terminal;
    a second emitter follower transistor having a base connected to said second node and a collector connected to said first power source terminal;
    an output emitter follower transistor having a base connected to an emitter of said first emitter follower transistor, and a collector-emitter path connected between said first power source terminal and said output terminal; and
    a first N-channel MOSFET having a gate connected to an emitter of said second emitter follower transistor, and a drain-source path connected between an emitter of said output emitter follower transistor and said second power source terminal.

17. A memory formed with a semiconductor integrated circuit according to claim 16, wherein said word line selecting circuit further comprises:
    a P-channel MOSFET having a gate connected to said emitter of said second emitter follower transistor, and a source-drain path connected between a collector and said base of said output emitter follower transistor.

18. A memory formed with a semiconductor integrated circuit according to claim 17, wherein said word line selecting circuit further comprises:
    a second N-channel MOSFET having a gate connected to said base of said first emitter follower transistor, and a drain-source path connected between said emitter of said second emitter follower transistor and said second power source terminal; and
    a third N-channel MOSFET having a gate connected to said base of said second emitter follower transistor, a drain connected to a drain of said second N-channel MOSFET, and a drain-source path connected between said emitter of said first emitter follower transistor and said second power source terminal.

19. A memory formed with a semiconductor integrated circuit according to claim 18, wherein said word line selecting circuit further comprises:
    a first current source provided between said emitter of said first bipolar transistor and said second power source terminal;
    a second current source provided between an source of said second N-channel MOSFET and said second power source terminal; and
    a third current source provided between a source of said first N-channel MOSFET and said second power source terminal.

20. A memory formed with a semiconductor integrated circuit according to claim 19, wherein said word line selecting circuit further comprises:
   a plurality of input terminals receiving a plurality of input signals; and
   a plurality of bipolar transistors which have bases connected to said input terminals, and which are connected in parallel with said first bipolar transistor.

21. A memory formed with a semiconductor integrated circuit according to claim 20, wherein said first current source includes an N-channel MOSFET having a constant voltage receiving gate and a drain-source path connected between said emitter of said first bipolar transistor and said second power source terminal, and wherein said second current source includes an N-channel MOSFET having a constant voltage receiving gate and a drain-source path connected between said source of said second N-channel MOSFET and said second power source terminal, and said third current source including an N-channel MOSFET having a constant voltage receiving gate and a drain-source path connected between said source of said first N-channel MOSFET and said second power source terminal.

22. A memory formed with a semiconductor integrated circuit according to claim 21, wherein said first and second bipolar transistors, said first and second emitter follower transistors and said output emitter follower transistor includes of NPN bipolar transistors.

23. A memory formed with a semiconductor integrated circuit according to claim 22, wherein said first load means includes a resistor provided between said first power source terminal and a collector of said first bipolar transistor, and wherein said second load means includes a resistor provided between said first power source terminal and said collector of said second bipolar transistor.

24. A memory formed with a semiconductor integrated circuit according to claim 23, further comprising:
   a data input buffer; and
   a pair of complementary data lines coupled to said data input buffer, wherein
   said pair of column switches include N-channel MOSFETs having gates receiving said output signal from said column selecting circuit, and drain-source paths between said pair of complementary data lines and said pair of common complementary data lines, respectively.

25. A memory formed with a semiconductor integrated according to claim 24, wherein said sense amplifier includes a third bipolar having a base connected to one of said pair of complementary data lines, and a fourth bipolar transistor having a base connected to the other of said pair of complementary data line, and an emitter provided in common with said third bipolar transistor, said column switches including an N-channel MOSFET having a gate receiving said output signal from said column selecting circuit, and a drain-source path connected between said emitter of said third and fourth bipolar transistors and said second power source terminal.

26. A memory formed with a semiconductor integrated circuit according to claim 25, wherein said memory cell comprises:
   a first inverter circuit including a P-channel MOSFET and an N-channel MOSFET; and a second inverter circuit including a P-channel MOSFET and an N-channel MOSFET adapted to receive an output signal from said first inverter circuit as an input signal and generate an input signal to be transmitted to said first inverter circuit.

27. A memory formed with a semiconductor integrated circuit according to claim 26, wherein said column selecting circuit has the same structure as said word line selecting circuit.

28. A memory formed with a semiconductor integrated circuit according to claim 27, further comprising:
   a predecoder circuit adapted to receive a plurality of complementary address signals, subject said complementary address signals to a logical operation and generate a plurality of level-shifted predecoding output signals, wherein said predecoding output signals are supplied as input signals to said word line selecting circuit or said column selecting circuit.

* * * * *